United States Patent [19]
Salatino et al.

[11] Patent Number: 5,798,557
[45] Date of Patent: Aug. 25, 1998

[54] LID WAFER BOND PACKAGING AND MICROMACHINING

[75] Inventors: Matthew M. Salatino, Satellite Beach; William R. Young, Palm Bay; Patrick A. Begley, West Melbourne, all of Fla.

[73] Assignee: Harris Corporation, Melbourne, Fla.

[21] Appl. No.: 705,536

[22] Filed: Aug. 29, 1996

[51] Int. Cl.⁶ .................................................. H01L 29/82
[52] U.S. Cl. .......................... 257/416; 257/433; 257/704; 257/787
[58] Field of Search ........................... 257/415, 416, 257/417, 433, 434, 704, 782, 787

[56] References Cited

U.S. PATENT DOCUMENTS 5,583,373  12/1996  Ball et al. .................. 257/704
5,610,431  3/1997  Martin ........................ 257/704

*Primary Examiner*—Minh-Loan Tran
*Attorney, Agent, or Firm*—Jaeckle Fleischmann & Mugel, LLP

[57] ABSTRACT

A wafer level hermetically packaged integrated circuit has a protective cover wafer bonded to a semiconductor device substrate wafer. The substrate wafer may contain a cavity. The cover wafer seals integrated circuits and other devices including but not limited to air bridge structures, resonant beams, surface acoustic wave (SAW) devices, trimmable resistors, and micromachines. Some devices, such as SAWs, are formed on the surface of cavities formed in the protective cover wafer. Die are separated to complete the process.

16 Claims, 4 Drawing Sheets

LID WAFER BOND PACKAGING AND MICROMACHINING

FIELD OF THE INVENTION

The present invention relates to a lid wafer bond package for microelectronic structures, micro machines, and micromachinable components, in particular, air bridge structures. The invention is especially suitable for use in providing integrated circuits that have machinable elements that are sealed so as to protect the machinable elements and allow the machining thereof.

BACKGROUND OF THE INVENTION

Integrated circuits are packaged at the individual die level. The integrated circuits are formed in the die of a semiconductor device wafer. During fabrication the die is covered with a passivation layer, typically silicon dioxide or silicon nitride, to protect the die during assembly and packaging. During assembly, the wafer is separated into a die by mounting it on an adhesive frame and sawing a plurality of cuts to separate the die from each other. A die attach machine removes the die from the frame and mounts it on a lead frame. The lead frame has a central die pad for supporting the die and a plurality of leads extending from the central die pad, typically one lead for each bond pad of the integrated circuit. The lead frame is passed through a wire bonding machine where a very fine conductive wire, typically aluminum or gold, is bonded from each bond pad to its corresponding lead on the lead frame. The wire bonded die is packaged in plastic. Plastic packaging is done in a molding operation where the wire bonded die is placed in a mold and molten plastic is injected into the mold. Ceramic packages are made by bonding the die to the lead frame in one-half of a ceramic shell and closing the shell with another ceramic half shell or lid. After packaging, lead frames are separated from each other and the leads are trimmed and bent into position. The packaged devices are assembled onto circuit boards with other devices where the different devices are interconnected to provide a system. So, assembly and packaging are both labor intensive and time-consuming, and have associated yield losses.

Conventional plastic and ceramic packages are many times the size of the die they protect. So, the packaging of the die occupies the majority of the space in any circuit board that interconnects integrated circuits. The overall size of computers and other electronic equipment would be greatly reduced if the packaged components were smaller. Smaller packages would be closer to one another, thereby reducing the size of metal traces that interconnect the integrated circuits on the circuit boards. With shorter traces to other circuits, the overall speed of the electronic system can be increased.

Integrated circuits often include micromachinable components such as trimmable resistors, fuses, and resonant beams. These components are machinable prior to application of a passivation layer or prior to encapsulation of the integrated circuit. However, there has developed a need for a micromachinable device that can be machined after packaging.

Integrated circuits often include components such as resonant beams, inductors, capacitors or air bridges which require hermetic cavities within the package. Plastic injection molded packages can not provide these hermetic cavities. Plastic packages with cavities will collect moisture that will damage the devices in the cavity.

SUMMARY OF THE INVENTION

The invention provides a method for simultaneously packaging semiconductor devices, other miniature devices and micro machines, at the wafer level. In the following description the term "integrated circuit" refers to a packaged microelectronic structure that comprises one or more semiconductor devices that are formed in one of the die of a wafer. A "micromachine" is a miniature structure formed in a die of a wafer. Examples of micromachines include but are not limited to inductors, capacitors, resonant beams, deformable mirror devices, valves and motors. The "substrate" is a die of the wafer that includes the microelectronic structure or micromachine.

The invention provides a method of packaging the individual die at the wafer level. An insulating layer is formed on a lid wafer. The insulating layer is masked and etched to form a plurality of cavities that correspond to the die of the device wafer. The lid wafer is hermetically bonded to the device wafer to form a bonded structure of the die covered by corresponding lid cavities. The lid wafer and the device wafer may contain one or more micromachines or micromachinable components. Such micromachines and machineable components may be formed in cavities of the device wafer. Both the lid and device wafer may comprise cavities for housing the micromachines and machineable components. The device wafer has contact pads that are electrically connected to the device, micromachine, or machineable component in the device die cavity. The micromachine or machinable component may be formed in the lid wafer. The lid wafer is bonded to the device wafer after a microelectronic structure is formed in the die of the device wafer. In one embodiment, the invention packages integrated circuits using a glass cover wafer bonded to a device semiconductor wafer. In all the embodiments, the invention provides a hermetic package that prevents moisture from harming the packaged devices.

The foregoing and other objects, features and advantages of the invention as well as presently preferred embodiments thereof and the best known techniques for fabricating integrated circuit structures in accordance with the invention will become more apparent from a reading of the following description in connection with the accompanying drawings.

DETAILED DESCRIPTION

Figure 1:
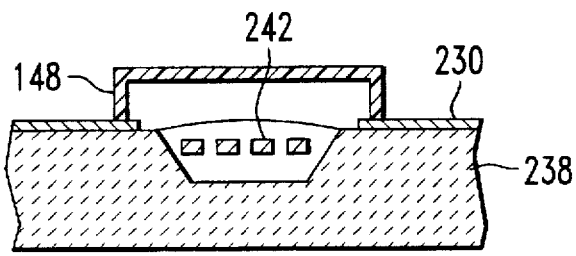
FIG. 1 is a cross sectional of an integrated circuit device having conductive members disposed in an air bridge configuration over an open space within the device encapsulated with a plastic cap.

Referring to FIG. 1 there is shown a proposed structure that applies individual caps or covers to the die. For example, a lid 148 covers air bridge conductors 242 in a device substrate 238 of semiconductor material, such as silicon. The air bridge conductors have sheaths (not shown) of insulative passivating material, usually silicon nitride, deposited on the conductors. A plastic cap 148 seals the air bridge. While such a proposed structure is possible, it would be difficult to handle and fix caps 148 to the device wafer 238. So, individually covering each die is not a practical solution.

Figure 2:
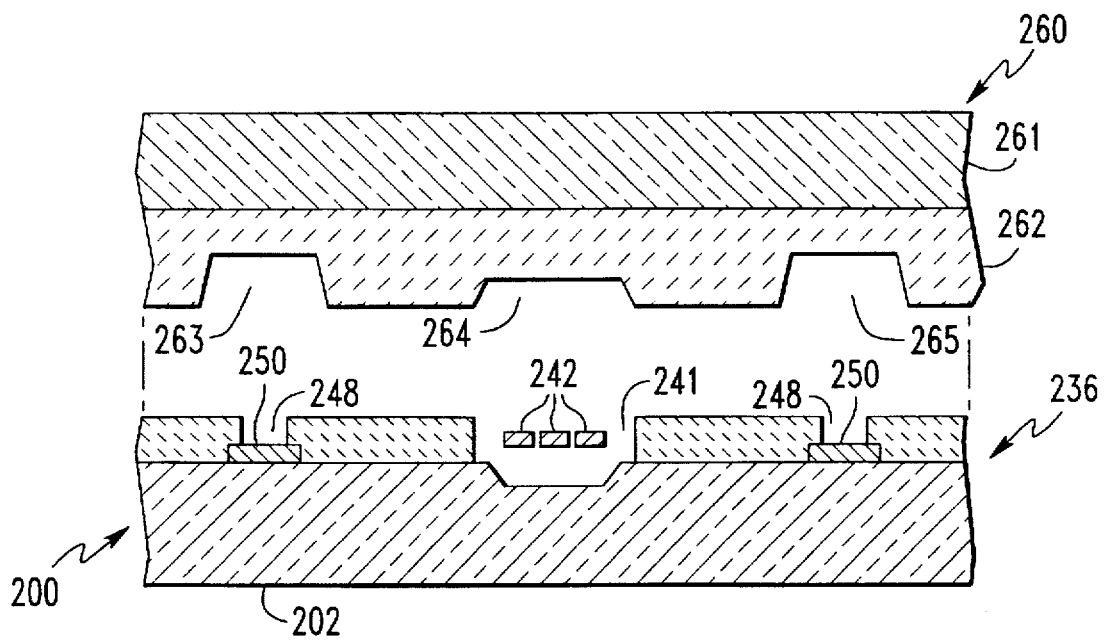
FIGS. 2 and 3 are cross sectional views of the device and lid layers before and after bonding.
Figure 3:
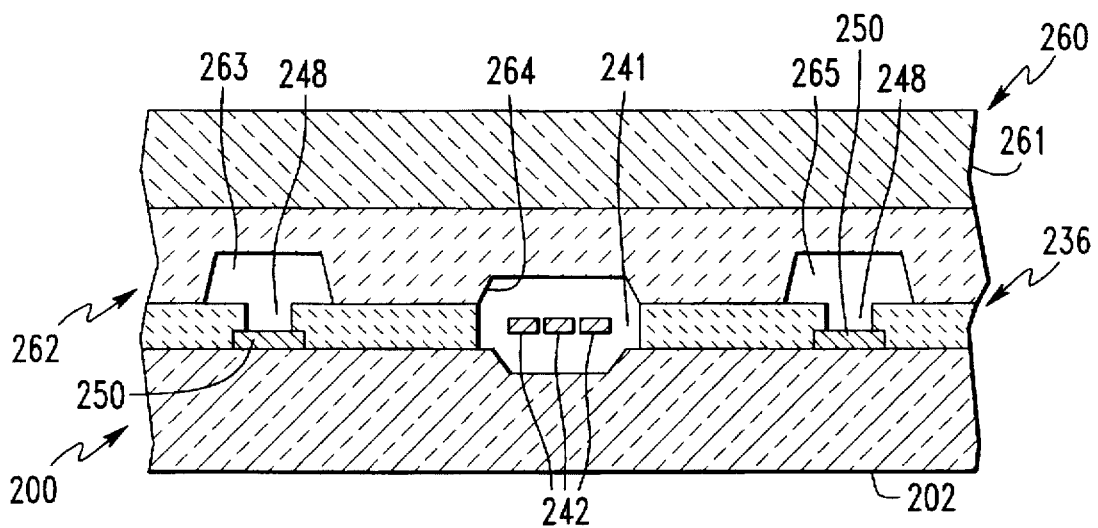

The invention overcomes the problems of the proposed structure by packaging the die at the wafer level. Referring to FIGS. 2 and 3 there is shown one die substrate 202 of a device wafer 200 of semiconductor material, such as silicon, in which a microelectronic air bridge structure 242 is formed. The semiconductor material may include other semiconductor material including but not limited to germanium, silicon germanium, silicon carbide, or gallium arsenide. Device wafer 200 is covered with an insulating layer 236, typically silicon dioxide. Insulating layers may comprise any suitable dielectric and may be the same material or different. Suitable dielectrics include but are not limited to silicon dioxide, silicon nitride, and silicon oxynitride. Openings 248 in the insulating layer 236 expose contact pads 250 that are electrically connected to the air bridge conductors 242. Conductors 242 are disposed over an air bridge cavity 241 in the substrate 202. Those skilled in the art will appreciate that other devices and microelectronic structures may be formed in the region occupied by the air bridge cavity 241. The conductors 242 are connected to contact pads 250 and are supported by the insulating layer 236. Lid wafer 260, typically silicon, has a silicon layer 261 and an insulating layer 262. Cavities 263, 264, 265 are formed by masking and etching operations. The cavities 263, 265 correspond to openings 248 over contact pads 250 and cavity 264 corresponds to air bridge cavity 241. The insulating layers 262 and 236 are brought into contact and heated to bond the lid wafer 260 to device wafer 200.

Figure 4:
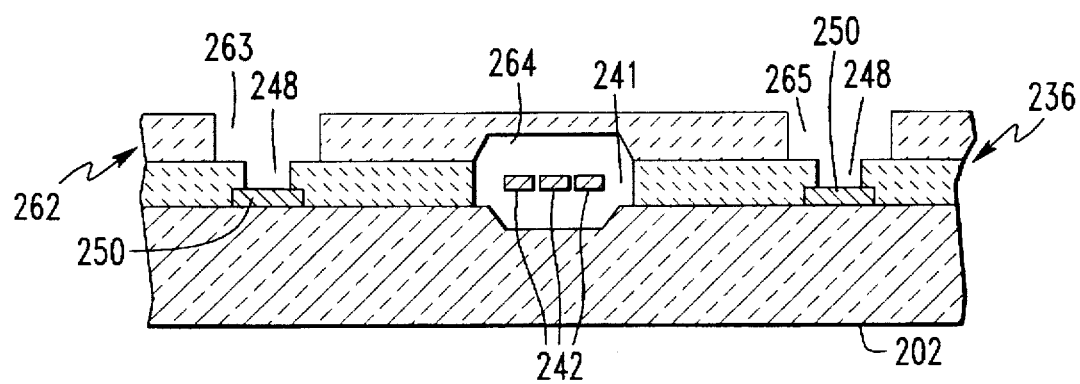
FIG. 4 is a cross sectional view of the device in FIGS. 2 and 3 after the lid wafer has been partially removed by lapping.

Referring to FIG. 3 and FIG. 4, the silicon layer 261 of the lid wafer 260 is removed and insulating layer 262 is thinned by etching or lapping to expose openings 248 and contact pads 250. External devices and power supplies are connected to the air bridge conductors 242 by electrically contacting contact pads 250.

Figure 5:
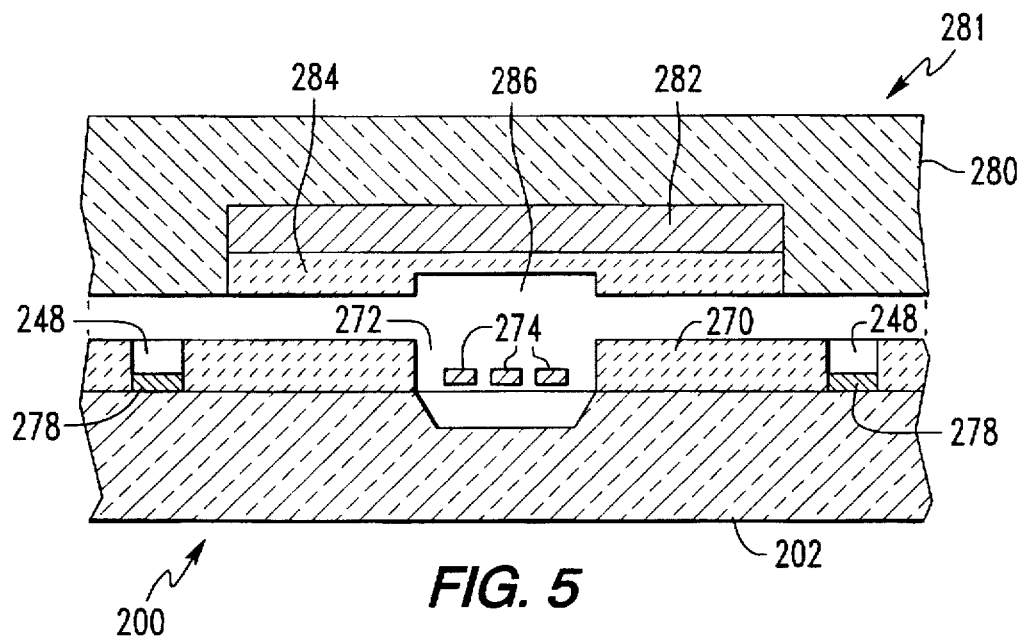
FIG. 5 is a cross sectional view of a device where the lid wafer comprises $p^+$ and $n^+$ silicon.
Figure 6:
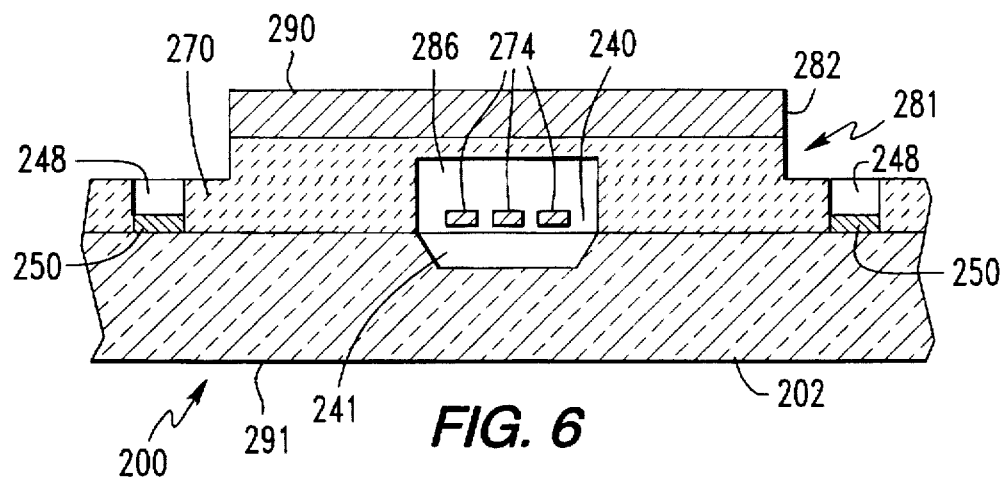
FIG. 6 is a cross sectional view of the device in FIG. 5 after the $n^+$ silicon has been etched from the device.

Turning to FIG. 5, a step in the process of making the device shown in FIG. 6 is shown. The structures in FIGS. 5 and 6 are similar to the structures in FIGS. 2–4. The device wafer 200 has an insulating layer 270 with an opening 272 bridged by conductors 274 that may form interconnections or passive components such as an inductor or capacitor. Contact pads 278 are exposed by openings 248 that are etched into the insulating layer 270. The lid wafer 281 is a multilayer structure having a $n^+$ silicon layer 280 overlaying a $p^+$ silicon layer 282 and an insulating layer 284 having a cavity 286. The $p^+$ layer 282 is formed by masking the surface of 281 and doping selected regions to form $p^+$ region 282. Then the surface above p-doped region 282 is oxidized to form insulating region 286. A rim of $n^+$ silicon edges the regions 282 and 286. The lid wafer 281 is attached by bonding the layers 270 and the surface of region 284, either by fusion bonds or with plastic polymer material such as PMMA (polymethylmethacrylate). The openings 248 are exposed and the device thinned to the form shown in FIG. 6 by using a KOH etch to remove the $n^+$ silicon. The openings 248 are then filled with metal contact material to connect contact pads 278 to other devices.

Referring to FIG. 6 there is shown a device similar to that shown in FIG. 4. The lid 281 is a multilayer structure of p-type silicon ($p^+Si$) 282 and an insulating layer 270 with cavity 286. Conductors 274 bridge a blind cavity 240 formed of cavity 286 in lid 281 and a cavity 241 in the silicon substrate 202. The substrate 202 has dielectric layer 270 with openings 248 to contact pads 250. The contact pads 250 are electrically connected to conductors 274. Instead of an air bridge structure, a microelectronic structure may be formed in the device substrate 202 in the region corresponding to the cavity 241. The opposite exterior surfaces 290 and 291 are etched so as to thin the device and improve heat flow and enable the microelectronic structures therein to operate at conditions that need rapid heat flow for device cooling.

Figure 7:
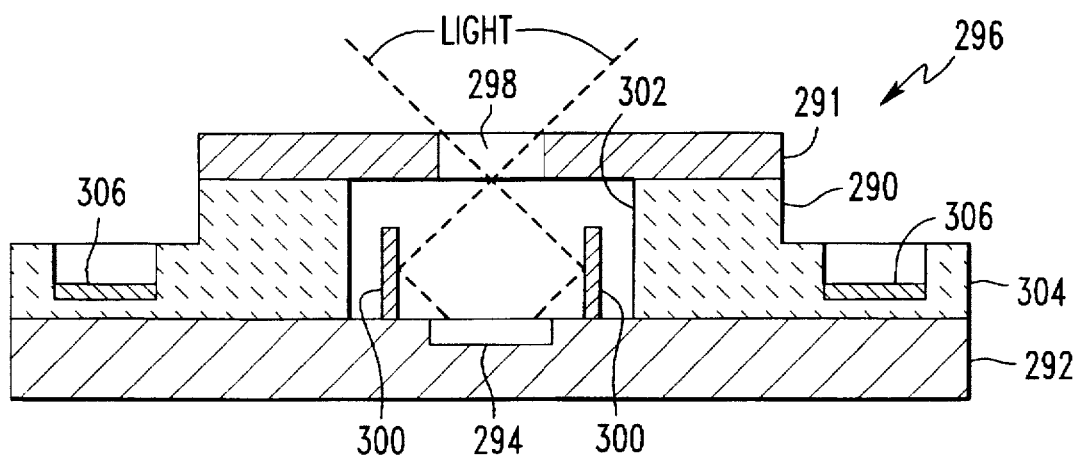
FIGS. 7 and 8 are the same view of the device in FIG. 6 where a transparent window is formed within the remaining portion of the lid wafer with either a photodetector, a laser trimmable resistor, or a resonant beam in the device wafer die.

Referring to FIG. 7 there is shown an optical device that may be made by the process used to fabricate the device shown in FIG. 6. There is provided a lid wafer 296 with a silicon layer 291 and an insulating layer 290 bonded with an insulating layer 304 of a device substrate 292. The device substrate 292 has a microelectronic structure with a photo emitter or a photo receptor (a photodetector) 294 formed therein by conventional processes. The lid wafer 296 is silicon with a window 298 of material transmissive to a beam of energy. In one embodiment the window is an optically transmissive material, such as silicon dioxide. Reflectors 300 surround an opening or cavity 302. Layer 304 contains bond pads 306 which provide connections to external circuits and to device 294 (not shown) in the device substrate 292. The reflectors 300 may be used to direct light onto or from a photosensitive element 294 formed in device substrate 292. Reflectors 300 may be a light shield to inhibit light in cavity 302 from reaching adjacent areas.

Figure 8:
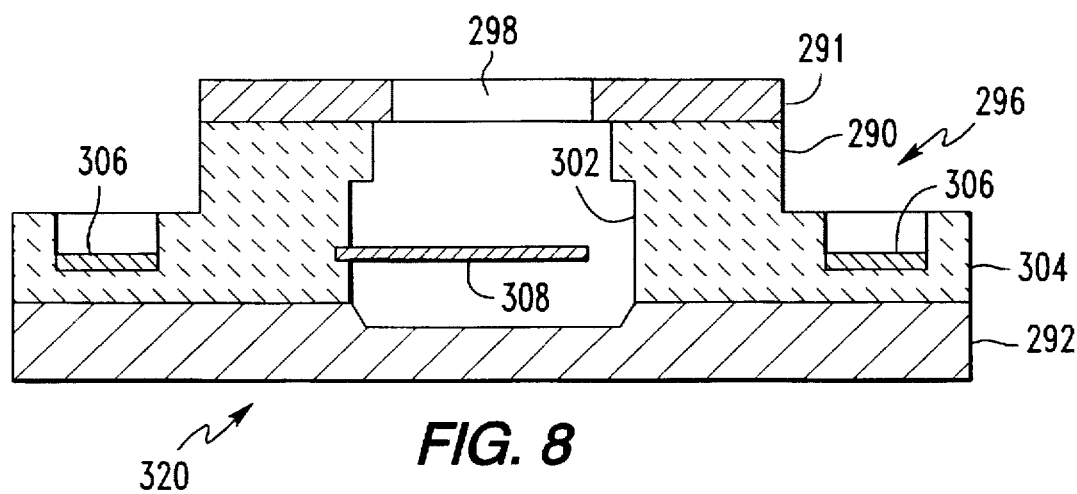

As shown in FIG. 8, the lid of a packaged integrated circuit 320 may have an optically opaque layer 291 of semiconductor material. A portion of the outer semiconductor material may be oxidized to provide a transparent window 298. In a further embodiment the window is colored to filter selected wavelengths of electromagnetic radiation.

The packaged device 320 is similar to that shown in FIG. 7 and like parts are indicated by like reference numerals. The cavity 302 has a conductor 308 formed into a resonant beam 308. The resonant beam 308 may be micromachined to have the desired mechanical resonance frequency by laser trimming via the window 298. The frequency of a circuit may be maintained constant at the resonant frequency of vibration of the beam 308 thereby providing an integrated circuit device that is useful in crystal oscillators and other stable frequency sources.

Those skilled in the art will appreciate that other miniature devices may be packaged at the wafer level using the method of the invention. Such other devices include but are not limited to ultraviolet erasable programmable read only memories and deformable mirror devices.

Figure 9:
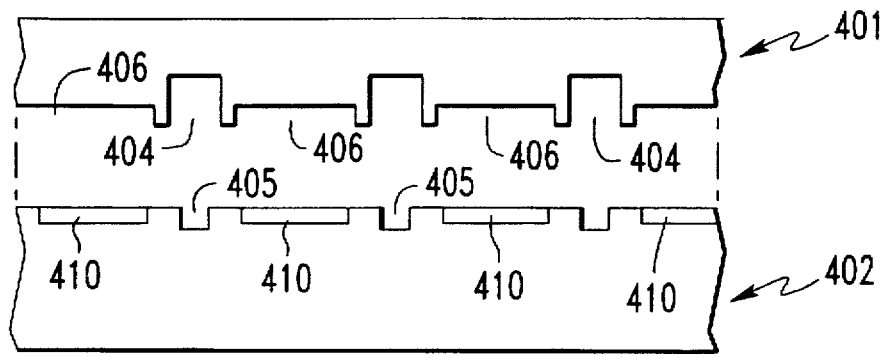
FIGS. 9 and 10 show sectional views of lid and device layers before and after bonding.

The invention also provides wafer level packaging using a glass or quartz cover wafer. Referring to FIG. 9 a cover wafer layer 401 and a silicon device wafer 402 are shown. The cover wafer 401 is patterned to form a plurality of cover cavities 406, each cavity corresponding to a die on the device wafer. The device wafer 402 is formed with a plurality of dies 410, where each die comprises at least one microelectronic structure, micromachine or machinable component. The device wafer 402 is further processed to have a pattern of scribe trenches 405 for separating adjacent dies from each other. The cover wafer 401 is likewise patterned to have scribe cavities 404 in a pattern corresponding to the device wafer scribe trenches and a series of die cover cavities 406 for covering dies 410. The depth of the scribe cavities 404 is greater than the depth of cover cavities 406. The cover wafer 401 is preferably either quartz or glass.

Figure 10:
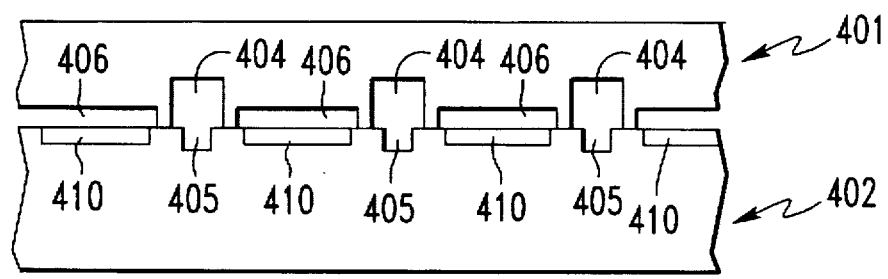
Figure 11:
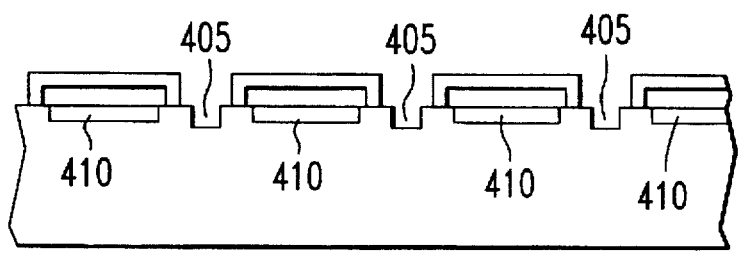
FIG. 11 shows the resulting quartz lids after the removing a portion of the insulating lid wafer.

Referring to FIG. 10 the cover wafer 401 is attached to the device wafer 402 with the cover cavities 406 aligned with the dies 410 and the scribe cavities 404 aligned with the scribe trenches 405. The cover wafer 401 may be attached to the device wafer 402 using a variety of compatible adhesion techniques, such as organic epoxies, reflowed glasses, or metal brazes. As shown in FIG. 11 the cover wafer is partially removed by etching or lapping until the scribe cavities are exposed to provide access to the scribe trenches 405. The individual dies can then be separated.

Figure 13:
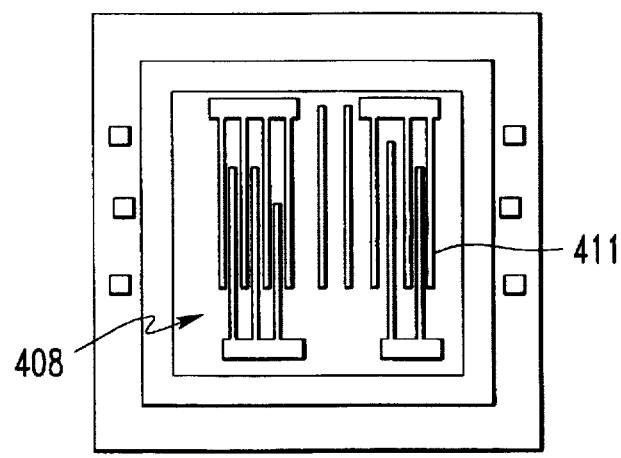
FIGS. 12 and 13 are a cross sectional view and a top view, respectively, of a circuit die with an attached lid having a SAW Filter Metal Pattern applied to the inner surface.
Figure 12:
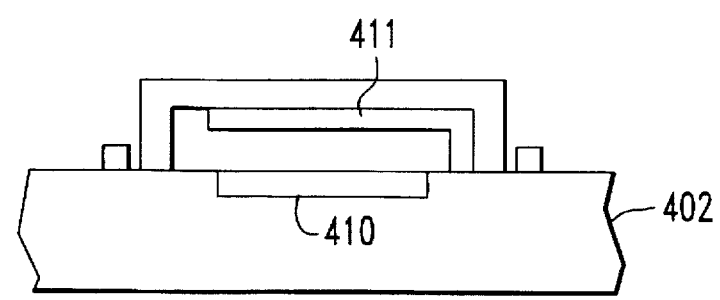

Referring to FIGS. 12 and 13 there is shown a side and top view of a single packaged integrated circuit where a pattern of SAW transducers 411 is applied to the inner surface of the cover cavity. The pattern of transducers forms an integrated SAW filter pattern 408 required in Ghz. RF systems. Those skilled in the art will appreciate that other devices may be formed in the device wafer 402 and such other devices include but are not limited to micromachines, machinable components, air bridges, trimmable resistors, resonant beams, and deformable mirror devices. The glass substrate may be transparent to a first electromagnetic spectrum and opaque to a second electromagnetic spectrum. The glass may be opaque or colored to filter one or more wavelengths of light.

From the foregoing description it will be apparent that there has been provided improved integrated circuit devices and methods of making the same. While several embodiments that obtain the features of the invention have been described, variations and modifications thereof within the scope of the invention will undoubtedly become apparent to those skilled in the art. The foregoing description should be taken as illustrative and not in a limiting sense.

We claim:

1. A packaged integrated circuit comprising:
   a semiconductor substrate comprising a first portion and a second portion on one side of the substrate; at least one device formed therein on said first portion;
   a protective cover bonded to the first portion semiconductor device substrate for sealing and covering the at least one device formed herein; and
   at least one electrical bond pad on the second portion of the semiconductor substrate, each said bond pad located outside the protective cover and electrically connected to the device in the semiconductor substrate.

2. The packaged integrated circuit of claim 1 wherein the semiconductor device substrate comprises a cavity for holding at least one device.

3. The packaged integrated circuit of claim 1 wherein the cover hermetically seals the at least one device in the semiconductor device substrate.

4. The packaged integrated circuit of claim 3 wherein the protective cover comprises a material selected from the group consisting of silicon, germanium, silicon germanium, gallium arsenide, glass and quartz.

5. The packaged integrated circuit of claim 1 wherein the device comprises a surface acoustic wave device on the surface of the protective cover opposite the at least one device.

6. The packaged integrated circuit of claim 1 wherein the protective cover is transparent to a first spectrum of electromagnetic radiation.

7. The packaged integrated circuit of claim 6 wherein the protective cover is opaque to a second spectrum of electromagnetic radiation.

8. The packaged integrated circuit of claim 1 wherein the protective cover is colored to filter selected wavelengths of electromagnetic radiation.

9. The packaged integrated circuit of claim 1 wherein the protective cover is opaque.

10. The packaged integrated circuit of claim 1 wherein the cover comprises an outer layer of semiconductor material.

11. The packaged integrated circuit of claim 10 wherein the semiconductor is silicon and a portion of the silicon is oxidized to provide a transparent window.

12. The packaged integrated circuit of claim 1 wherein the circuit comprises an air bridge structure.

13. The packaged integrated circuit of claim 1 wherein the device substrate comprises a microelectronic structure.

14. The packaged integrated circuit of claim 1 wherein the circuit comprises a photosensitive element.

15. The packaged integrated circuit of claim 1 wherein the circuit comprises a trimmable resistor structure.

16. The packaged integrated circuit of claim 1 wherein the device substrate comprises a resonant beam.

* * * * *